United States Patent
Baca et al.

(10) Patent No.: US 7,605,592 B2
(45) Date of Patent: Oct. 20, 2009

(54) LAMINATED CORE TESTING DEVICE

(75) Inventors: Matthias Baca, Lünen (DE); Peter Haschke, Oberhausen (DE); Claus-Georg Richter, Mülheim an der Ruhr (DE); Hans-Bernd Twellmann, Mülheim an der Ruhr (DE)

(73) Assignee: Siemens Aktiengesellschaft, Munich (DE)

( * ) Notice: Subject to any disclaimer, the term of this patent is extended or adjusted under 35 U.S.C. 154(b) by 141 days.

(21) Appl. No.: 10/549,247

(22) PCT Filed: Dec. 18, 2003

(86) PCT No.: PCT/DE03/04185

§ 371 (c)(1), (2), (4) Date: Jun. 19, 2006

(87) PCT Pub. No.: WO2004/081594

PCT Pub. Date: Sep. 23, 2004

(65) Prior Publication Data
US 2006/0219921 A1   Oct. 5, 2006

(30) Foreign Application Priority Data
Mar. 12, 2003  (DE) .................. 103 11 182

(51) Int. Cl.
G01R 31/06 (2006.01)
G01N 27/72 (2006.01)
G05D 23/00 (2006.01)

(52) U.S. Cl. .................. 324/545; 324/239; 318/641
(58) Field of Classification Search .................. 324/545
See application file for complete search history.

(56) References Cited

U.S. PATENT DOCUMENTS

| | | | | |
|---|---|---|---|---|
| 4,573,012 A | * | 2/1986 | Bisson et al. | 324/222 |
| 4,827,487 A | * | 5/1989 | Twerdochlib | 374/152 |
| 4,996,486 A | * | 2/1991 | Posedel | 324/545 |
| 5,097,241 A | * | 3/1992 | Smith et al. | 336/60 |
| 6,791,351 B2 | * | 9/2004 | Fischer et al. | 324/772 |
| 6,815,957 B2 | * | 11/2004 | Hobelsberger et al. | 324/545 |
| 7,042,229 B2 | * | 5/2006 | Lee et al. | 324/551 |
| 2003/0117144 A1 | * | 6/2003 | Sutton | 324/546 |
| 2003/0210059 A1 | * | 11/2003 | Kliman et al. | 324/545 |

FOREIGN PATENT DOCUMENTS

| | | |
|---|---|---|
| DE | 2 242 243 | 3/1974 |
| DE | 39 25 047 A1 | 1/1991 |
| EP | 0 384 987 A1 | 9/1990 |
| JP | 60074417 A | 4/1985 |
| JP | 60074418 A | 4/1985 |

OTHER PUBLICATIONS

Paul S. Hamer; "Acceptance Testing of Electric Motors and Generators"; IEEE, Paper No. PCIC-87-5; Oct. 1988, pp. 1291-1304.

* cited by examiner

*Primary Examiner*—Jeff Natalini

(57) ABSTRACT

A laminated core testing device for testing laminated cores in a generator is provided. The laminated core testing device includes an exciting winding situated parallel to a rotation axis of the generator and connected to a secondary alternating current generator, and further includes an infrared image acquisition device for acquiring infrared recordings. The secondary alternating current generator has a controllable frequency converter, and the secondary alternating current generator, at a frequency ranging from 400 Hz to 600 Hz, provides, in a single-phase manner, an output of 200 kW with a controllable output voltage ranging from 0 V to 3.0 kV.

11 Claims, 2 Drawing Sheets

LAMINATED CORE TESTING DEVICE

CROSS REFERENCE TO RELATED APPLICATION

This application is the US National Stage of International Application No. PCT/DE2003/004185, filed Dec. 18, 2003 and claims the benefit thereof. The International Application claims the benefits of German Patent application No. 10311182.4 DE filed Mar. 12, 2003, both of the applications are incorporated by reference herein in their entirety.

FIELD OF THE INVENTION

The invention relates to a laminated core testing arrangement for the purpose of testing laminated cores in a generator, the laminated core testing arrangement having a field winding, which lies in parallel with an axis of rotation of the generator and is connected to a high-voltage testing device producing alternating current, as well as an infrared image detection device which is designed to detect infrared radiation.

The invention also relates to a method for testing for faults in a stator of a generator, a high-voltage testing device producing alternating current being connected to a field winding which lies in parallel with an axis of rotation of the generator, and infrared beams being detected in the direction of the axis of rotation using an infrared image detection device.

Furthermore, the invention relates to a high-voltage testing device for a laminated core testing arrangement.

BACKGROUND OF THE INVENTION

In generator design today, it is necessary to inspect generators intended for local and commercial energy generation for faults in the context of tests for early detection of damage. Faults may be damage in the rotor winding or damage in the stator. In the stator, damage may occur, inter alia, in the laminated cores or in the stator winding. The laminated cores are installed transversely with respect to an axis of rotation. In order to accommodate the stator winding, which generally comprises copper lines having a rectangular cross section, the laminated cores are provided with slots. The stator winding is introduced into the slots in an insulated manner. The stator winding is insulated with respect to the laminated cores.

The rotor of a generator has a rotor winding through which electrical current flows, the current level being up to 10,000 A in the case of modern generators. The electrical current is generally transmitted from an external power supply by means of sliprings and carbon brushes. In the case of limit-rating generators, the field current is produced by excitation machines having rotating rectifier wheels.

The electrical current induces a rotating magnetic field which in turn induces voltages in the stator winding located in the stator housing. An electrical current with considerably high current levels flows in the stator winding. The high current levels lead to the stator winding located in the slots being heated. The insulation between the stator winding and the laminated core may be damaged. If such damage occurs, the laminated core is heated in the local vicinity of the damaged insulation. Further damage could not be ruled out.

The insulation between the stator winding and the laminated cores is generally inspected for damage. A recent test method is to remove the rotor and to simulate an operating state which leads to heating of the laminated core. If the operating temperature is reached, an infrared recording of the stator winding and of the laminated cores is created by means of an infrared camera in a direction parallel to the axis of rotation. Faults or damage can be identified as so-called hot-spots and localized. The damage is eliminated prior to use.

Simulation of the operating state is nowadays performed by an arrangement which has a high-voltage generator and two or more phases of a field winding. The phases of the field winding are laid in parallel with the axis of rotation. The high-voltage generator is electrically connected to the field winding and produces an output voltage of up to 6 kV at a current level of approximately 700 to 800 A. The AC voltage induces a magnetic flux or an alternating magnetic field in the laminated core which leads to desired heating owing to hysteresis losses, and this heating is comparable to the heating in the operating state.

Since the generators are generally tested in situ, it is virtually impossible to have a high-voltage generator available. To date only stationary high-voltage generators have been known which cannot be used in a power station.

Until now, the laminated cores have been tested in the factory. A further possibility for testing the stator winding and the laminated cores is the so-called EL-CID test which provides, however, limited information in the case of insulated laminated stator cores.

SUMMARY OF THE INVENTION

One object of the invention is to specify a further method and an apparatus for testing a generator which can be transported easily.

The object in relation to the laminated core testing arrangement is achieved by a laminated core testing arrangement for the purpose of testing laminated cores in a generator, the laminated core testing arrangement having a field winding, which lies in parallel with an axis of rotation of the generator and is connected to a high-voltage testing device producing alternating current, as well as an infrared image detection device which is designed to detect infrared radiation, the high-voltage testing device making available, at a frequency of more than 50 Hz, a power in single-phase form at an output voltage of at least 400 V which can be regulated.

The object in relation to the high-voltage testing device is achieved by a high-voltage testing device which produces a single-phase output signal which can be regulated having an output voltage of at least 400 V and an output frequency of more than 50 Hz.

The object in relation to the method is achieved by a method for testing for faults in a stator of a generator, an AC testing device producing alternating current being connected to a field winding which lies in parallel with an axis of rotation of the generator, and infrared beams being detected in the direction of the axis of rotation using an infrared image detection device, the high-voltage testing device at a frequency of greater than 50 Hz making available a power in single-phase form at an output voltage of at least 400 V which can be regulated, and the detected infrared radiation being inspected for hot-spots which point towards faults in the generator.

The advantage can be considered, inter alia, to be the fact that an apparatus has been found with which it is possible to test generators for damage in situ.

The laminated core testing arrangement expediently has a controllable frequency converter for the purpose of converting a fundamental frequency into a higher frequency.

In order to make it possible to connect the laminated core testing arrangement to an AC power supply, the high-voltage testing device has an input side which can be connected to a three-phase power supply.

The three-phase power supply expediently has a three-phase 400 V AC voltage.

The high-voltage testing device expediently makes available an electrical power at a frequency of greater than 400 Hz.

Owing to an embodiment in which the field winding has at least two lines, it is possible to decrease the physical size of the laminated core testing arrangement further still. As a result, transportation of the laminated core testing arrangement is made easier.

BRIEF DESCRIPTION OF THE DRAWINGS

Exemplary embodiments will be described with reference to the description and the figures, in which components provided with the same references have the same function and in which.

DETAILED DESCRIPTION OF THE INVENTION

Figure 1:
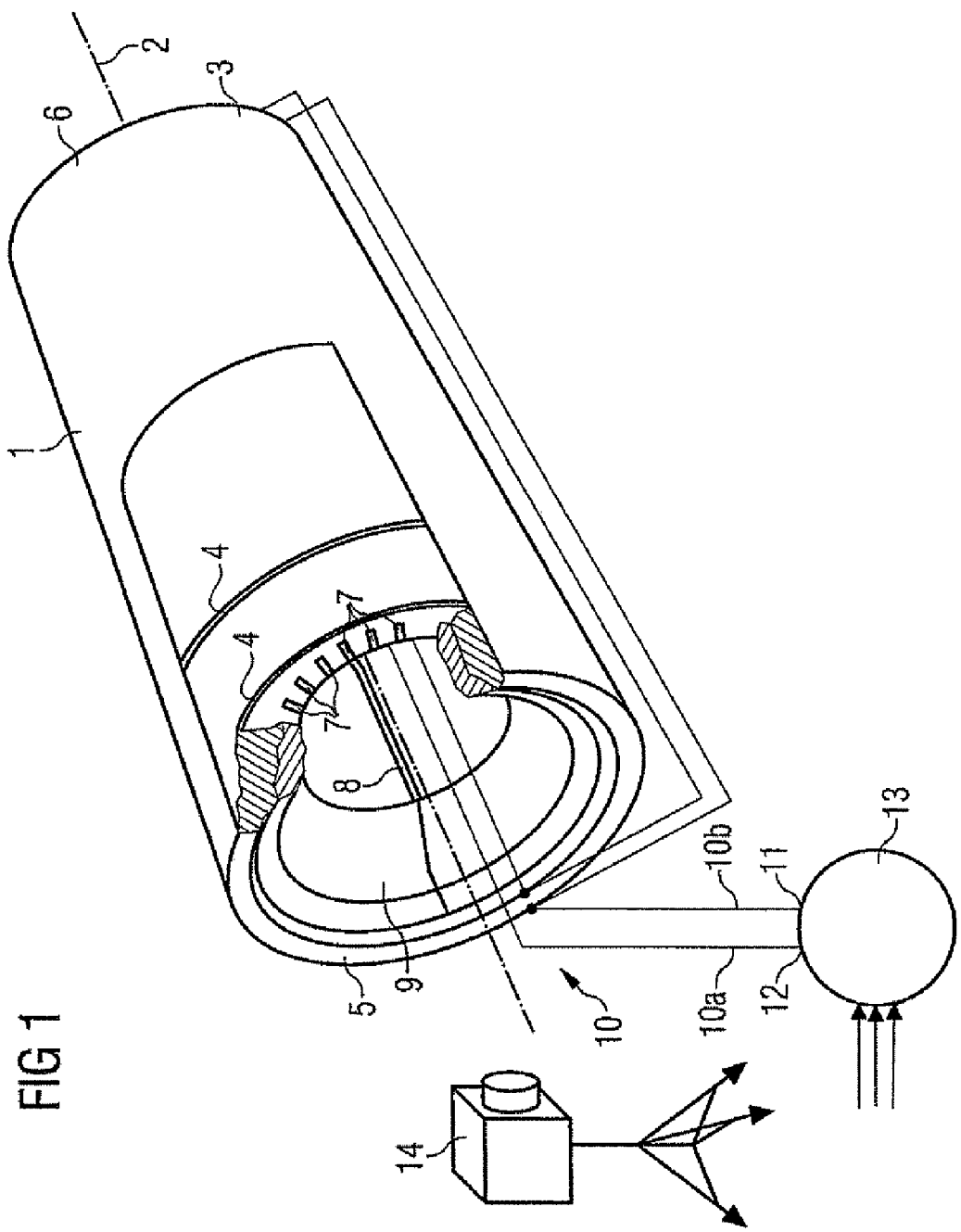
FIG. 1 shows the design of a laminated core testing arrangement.

FIG. 1 illustrates the design of a laminated core testing arrangement. A generator (not completely illustrated) has a stator 1. The stator 1 is designed to be symmetrical with respect to an axis of rotation 2. The stator 1 has an outer housing 3. Laminated cores 4 are arranged perpendicularly and symmetrically with respect to the axis of rotation 2. For reasons of clarity, only two laminated cores 4 are illustrated in FIG. 1. The laminated cores 4 are arranged within the outer housing 3 from a stator start 5 to a stator end 6. The laminated cores 4 are fixed in the direction of the axis of rotation 2 in a manner which is not illustrated in more detail.

The laminated cores 4 have two or more slots 7 which are arranged symmetrically in the circumferential direction of the outer housing 3. A stator winding, which is formed from two or more stator winding bars 8, is arranged in the slots 7 of the laminated cores 4 in a manner which is not illustrated in any more detail. For reasons of clarity, only one stator winding bar 8 is illustrated in FIG. 1.

A rotor (not illustrated) is mounted such that it can rotate about the axis of rotation 2 in an inner opening 9 in the generator. The rotor has a rotor winding which comprises two or more groups of coils and through which a field current of up to 10,000 A flows. The rotor is induced to rotate about the axis of rotation 2 by means of a rotation device (not illustrated). The rotation device could comprise a steam turbine, a gas turbine or a combination of gas and steam turbines.

Owing to the field current and the rotating movement of the rotor, an electrical voltage is induced in the stator winding, and this electrical voltage can be made available as useful current via end stator winding bars (not illustrated).

The voltages and currents in the stator winding can assume values of up to 27,000 V and up to 35,000 A during operation. Such high currents result in a considerable amount of heat generation.

Insulation (not illustrated in any more detail) is provided between the slots 7 in the laminated cores 5 and the stator winding bars 8. The insulation prevents the electrical current from flowing in an uncontrolled manner and, as a result, a potential critical temperature increase.

In one test state which can be carried out in situ, a field winding 10 is arranged in the direction of the axis of rotation 2. In this embodiment, the field winding 10 has two field winding lines 10a, 10b. In an alternative embodiment, the field winding may have two or more field winding lines. The field winding lines 10a, 10b preferably lie on the axis of rotation 2. The field winding has two field winding ends 11, 12 which are coupled to a high-voltage testing device 13. The high-voltage testing device 13 makes available an alternating current at a frequency of greater than 50 Hz in single-phase form at an output voltage of at least 400 V which can be regulated.

In one preferred embodiment, the high-voltage testing device 13 produces a single-phase output signal which can be regulated having an output voltage of at least 400 V and an output frequency of from more than 400 Hz up to 600 Hz in sinusoidal form. In a further preferred embodiment, the high-voltage testing device 13 produces an output voltage of more than 3.0 kV, in particular 2.0 kV.

The high-voltage testing device 13 has a controllable frequency converter for the purpose of converting a fundamental frequency into a higher frequency.

In one alternative embodiment, the high-voltage testing device has an input side which can be connected to an AC power supply. The AC power supply may in this case be a three-phase 400 V AC voltage.

Furthermore, the geometric dimensions and the weight of the high-voltage testing device 13 are such that transportation is possible in a simple manner.

It has surprisingly been found that, owing to the output voltage, the power and the frequency of the high-voltage testing device 13, a situation can be simulated which produces a state which comes very close to the state during normal operation of the generator.

Until now, laminated core tests have been carried out at frequencies of 50 Hz and output voltages of up to 6 kV. Until now there have been technical provisions for carrying out laminated core tests at higher frequencies and at lower output voltages.

The longitudinal voltages which are achieved in the novel laminated core testing arrangements are virtually identical to the values of the longitudinal voltages of the known laminated core testing arrangements.

Figure 2:
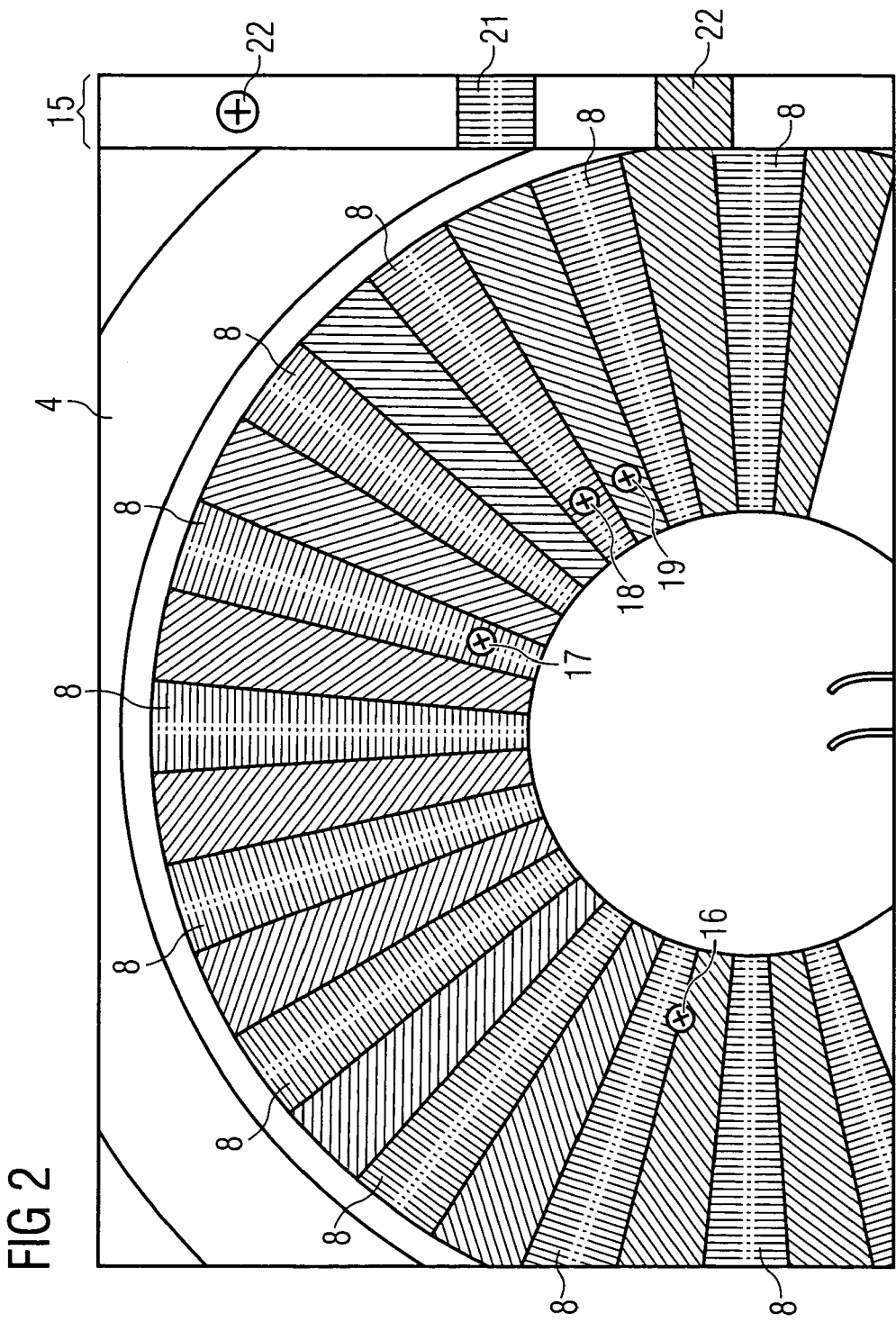
FIG. 2 shows an infrared recording.

FIG. 2 shows a markedly simplified infrared recording which has been created by the infrared image detection device 14 during a test run. The infrared recording shows a section of the laminated cores 4 and the stator winding bar 8. In this case, the temperature of the laminated cores 4 and of the stator winding bar 8 is illustrated so as to correspond to an assignment scale 15. The allocation of a two-dimensional illustration and temperature can be seen in the assignment scale 15.

The hatched temperature 20 is lower than the dash-dotted temperature 21. The temperature 22 illustrated by an x is even higher than the dash-dotted temperature. For example, the temperature 20 is 20° C., the temperature 21 is 26° C. and the temperature 22 is 30° C.

An infrared image detection device 14 is preferably arranged on the axis of rotation 2. The infrared image detection device 14 provides the possibility of detecting infrared radiation within the outer housing 3. The infrared recording shows a heat distribution across the laminated cores 4, the slots 7 and the stator winding bars 8.

For reasons of clarity, only three temperature values are illustrated in FIG. 2.

The infrared recording is evaluated during a test method. The temperature distribution should be as homogeneous and symmetrical with respect to the axis of rotation 2 as possible. The infrared recording shown in FIG. 2 shows that higher local temperatures prevail at different points.

These different points can be identified as damage 16, 17, 18, 19.

The different points having a higher local temperature are also known as hot-spots. Owing to the identification and localization of damage, it is possible for repair measures to be introduced. Subsequent damage during normal operation can be prevented effectively.

The invention claimed is:

1. A laminated core testing device to test a laminated core in a generator, comprising:
   a field winding that lies in parallel with an axis of rotation of the generator and is connected to a high-voltage testing device that produces alternating current during a test to simulate an operational state of the generator; and
   an infrared image detection device that is designed to detect infrared radiation during the simulated operational state of the generator;
   wherein the high-voltage testing device is configured to simulate the operational state of the generator by outputting a fundamental frequency and a power in single-phase form at an output voltage of at least 400 V that can be regulated, wherein the high-voltage testing device comprises a frequency converter for converting the fundamental frequency to a frequency that is greater than 50 Hz to energize the field winding at the greater frequency value and cause a thermal response indicative of at least one hot spot in the laminated core during the simulated operational state of the generator.

2. The laminated core testing device as claimed in claim 1, wherein the high-voltage testing device has an input side which can be connected to a three-phase power supply.

3. The laminated core testing device as claimed in claim 2, wherein the three-phase power supply has a three-phase 400 V AC voltage.

4. The laminated core testing device as claimed in claim 1, wherein the high-voltage testing device makes available the electrical power at a frequency of greater than 400 Hz.

5. The laminated core testing device as claimed in claim 1, wherein the field winding comprises at least two lines.

6. The laminated core testing device as claimed in claim 1, wherein the high-voltage testing device is in the form of a transportable device.

7. A high-voltage testing device for testing a laminated core in a generator, comprising:
   a single-phase output signal that can be regulated during a test to simulate an operational state of the generator; and
   an output voltage of at least 400 V having a fundamental frequency, wherein the high-voltage testing device comprises a frequency converter for converting the fundamental frequency to a frequency that is greater than 50 Hz to simulate the operational state of the generator, wherein a field winding is energized at the greater frequency value to cause during the simulated operational state of the generator a thermal response indicative of at least one hot spot in the laminated core, wherein the thermal response is detected by an infrared image detection device configured to detect infrared radiation during the simulated operational state of the generator.

8. The high-voltage testing device as claimed in claim 7, further comprising an input side that can be connected to a three-phase power supply.

9. The high-voltage testing device as claimed in claim 8, wherein the input side can be connected to a three-phase 400 V AC voltage.

10. The high-voltage testing device as claimed in claim 7, wherein electrical power at a frequency of greater than 400 Hz is made available.

11. A method for testing for faults in a laminated core of a generator, comprising:
    producing alternating current via a high-voltage testing device during a test to simulate an operational state of the generator;
    connecting the high-voltage testing device during the simulated operational state of the generator to a field winding that lies in parallel with an axis of rotation of the generator;
    detecting and recording infrared beams in the direction of the axis of rotation using an infrared image detection device;
    making available power in a single phase form via the high-voltage testing device at a fundamental frequency and at an output voltage of at least 400 V that can be regulated;
    converting the fundamental frequency to a frequency that is greater than 50 Hz;
    energizing the field winding at the greater frequency value to cause a thermal response indicative of at least one hot spot in the laminated core; and
    inspecting a detected infrared recording for said at least one hot spot obtained during the simulated operational state of the generator, said at least one hot spot pointing towards faults in the laminated core of the generator.

* * * * *

UNITED STATES PATENT AND TRADEMARK OFFICE
CERTIFICATE OF CORRECTION

PATENT NO. : 7,605,592 B2 Page 1 of 1
APPLICATION NO. : 10/549247
DATED : October 20, 2009
INVENTOR(S) : Baca et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 166 days.

Signed and Sealed this

Fifth Day of October, 2010

David J. Kappos
*Director of the United States Patent and Trademark Office*